United States Patent [19]

Takenouchi et al.

[11] Patent Number: 4,567,374
[45] Date of Patent: Jan. 28, 1986

[54] PHOTOELECTRIC CONVERTING DEVICE WITH A PLURALITY OF DIVIDED ELECTRODES

[75] Inventors: Mutsuo Takenouchi; Takashi Ozawa; Toshihisa Hamano; Hisao Itoh; Mario Fuse; Takeshi Nakamura, all of Hongo Ebina, Japan

[73] Assignee: Fuji Xerox Co., Ltd., Tokyo, Japan

[21] Appl. No.: 494,666

[22] Filed: May 16, 1983

Related U.S. Application Data

[63] Continuation-in-part of Ser. No. 329,471, Dec. 10, 1981, Pat. No. 4,419,696.

[30] Foreign Application Priority Data

May 17, 1982 [JP] Japan .................................. 57-82927

[51] Int. Cl.[4] ......................... H01L 27/14; H04N 1/02
[52] U.S. Cl. ................................ 250/578; 250/211 R; 357/2; 358/212; 358/294
[58] Field of Search ................ 250/578, 211 J, 211 R; 357/30, 31, 32, 2; 358/212, 213, 293, 294

[56] References Cited

U.S. PATENT DOCUMENTS 4,419,696 12/1983 Hamano et al. ................ 250/578 X Primary Examiner—Edward P. Westin
Attorney, Agent, or Firm—Handal & Morofsky

[57] ABSTRACT

An improved photoelectric converting device in a layered structure comprising a base board, a plurality of divided electrodes, a photoelectric film and a common electrode is disclosed, wherein the improvement consists in that the width of a photoelectric current lead-out portion extending from each of the divided electrodes is dimensioned less than that of the body constituting the latter whereby an area of an intersected part formed by a combination of the divided electrodes and the common electrode, i.e., an area of each of light beam receiving sections becomes relatively constant among them, resulting in substantial reduction of an effect of unevenness or irregularity along the end part of the common electrode on image reproductivity of the respective light beam receiving sections.

5 Claims, 11 Drawing Figures

PHOTOELECTRIC CONVERTING DEVICE WITH A PLURALITY OF DIVIDED ELECTRODES

CROSS-REFERENCE TO RELATED PATENT APPLICATION

This application is a continuation-in-part of copending U.S. patent application Ser. No. 329,471 of Hamano et al., filed Dec. 10, 1981 and now U.S. Pat. No. 4,419,696.

BACKGROUND OF THE INVENTION

The present invention relates to an improved photoelectric converting device and more particularly to a thin and elongated photoelectric converting device to be in use for facsimile equipment, remote copier or other similar image processing apparatus.

Photodiode, phototransistor, CCD sensors and others have been heretofore known as typical photoelectric converting devices in which an optical signal is converted into an electric signal. These conventional photoelectric converting devices usually have small photoelectric surfaces smaller than an image to be read out and therefore it is necessary to provide an optical system for reducing the image.

In view of the foregoing inconvenience with the conventional image processing apparatus there has been proposed a thin, elongated photoelectric converting device adapted to read out an original image as it is without any optical reduction.

An example of such conventional photoelectric converting device is as illustrated in FIGS. 1(A) and 1(B). In the drawings, FIG. 1(A) is a perspective view illustrating the whole structure of the film type photoelectric converting device and FIG. 1(B) is a perspective view of the device shown in a disassembled state. As will be apparent from the drawings, the film type photoelectric converting device as identified with reference numeral 90 comprises a plurality of divided electrodes 92 (four divided electrodes in the illustrated example) formed on an electric insulative base board 91, a layer of photoelectric film 93 coated over a portion of said divided electrodes 92 and a layer of common electrode 94 deposited on said photoelectric film 93.

The insulative base board 91 is made of glass, ceramic, metallic plate with the surface being coated with insulating material, silicon wafer or the like material. Aluminum, cromium, plutinum, composite film of tin oxide ($SnO_2$) and indium oxide ($In_2O_3$) (hereinafter referred to as ITO film) or the like material is employed for the divided electrodes 92. Hydrided amorphous silicon (inclusive of n type only with hydrogen included and P type with an acceptor doped therein), selenium-tellurium-arsenic (Se—Te—As), cadmium sulfide (CdS), cadmium selenide (CdSe), cadmium telluride (CdTe) or the like material is employed for the photoelectric film 93. Further, ITO film, tin oxide ($SnO_2$), indium oxide ($In_2O_3$) aluminum (Al), chromium (Cr), gold (Au) or the like material is employed for the common electrode 94.

The charcteristics of the conjunction sections between the divided electrodes 92 and the photoelectric film 93 as well as between the latter and the common electrode 94 is determined by a combination among the above-mentioned materials. Whether these characteristics are to be made ohmic, in an inhibitive type or in a diode type will be decided depending on the signal read-out circuit.

Further, the conventional film type photoelectric converting device is illustrated in FIGS. 2 and 3, wherein FIG. 2 is a plan view of the device as seen in the direction identified with an arrow mark II in FIG. 1(A) and FIG. 3 is a front view of the same as seen in the direction identified with an arrow mark III in FIG. 1(A). In FIGS. 2 and 3, the whole surface of the photoelectric film 93 does not perform photoelectric conversion, but only a light beam receiving section 95 which is defined by an area where the upper common electrode 94 is superimposed on the lower divided electrodes 92 in a cross relation performs the photoelectric conversion.

It should be noted that there is necessity for making at least one of the electrodes 92 and 94 of transparent material so as to assure that light beam coming from the outside can be introduced thereinto and moreover in the case where a light beam is emitted from the side of the divided electrodes 92, the insulative base board 91 should also be made of transparent material.

Referring now to FIG. 4 which illustrates an example of a signal read-out circuit, each of the divided electrodes 92 is connected to the one input terminal of an amplifier 83 via a plurality of semiconductor switches 82, and the common electrode 94 is connected to the other input terminal of the same via a power source 81. Thus, one of the light beam receiving sections 95 is selected out by the corresponding semiconductor switch 82 and a signal generated from the selected section is outputted from the amplifier 83 after it is amplified therein.

Referring to FIG. 5, the conventional film type photoelectric converting device as constructed in the above-described manner is arranged, for instance, in a facsimile telegraphic apparatus. An original (not shown) is delivered downward from the above by means of a roller 88 adapted to rotate in the direction identified with an arrow mark F1 in FIG. 5 while light beam is emitted in the direction of an arrow mark F2 toward the downwardly moving original on the roller 88 from a light source 89. The light beam is then reflected in the direction of an arrow mark F2′, from the original and enters the photoelectric converting device 87. Auxiliary scanning to be effected in the direction of feeding of the original is mechanically undertaken by a motor (not shown), whereas main scanning to be effected at right angle relative to said auxiliary scanning is electrically undertaken by the semiconductors in FIG. 4.

As will be readily understood from FIGS. 1 to 3, any irregularity at the end part of the common electrode 94 causes unfavorable effect on the reproduction of image because a size of the light beam receiving section 95 is closely related to image reproductivity.

SUMMARY OF THE INVENTION

The present invention has been made with the foregoing background in mind.

Thus, it is an object of the present invention to provide an improved film type photoelectric converting device which assures substantial reduction in fluctuation of image reproductivity with respect to a single picture element as well as between the adjacent ones.

It is another object of the present invention to provide an improved film type photoelectric converting device which has excellently high practicability.

To accomplish these objects there is proposed in accordance with the present invention a film type photoelectric converting device which is designed such that the width of a photoelectric current lead-out portion extending from each of the divided electrodes is dimensioned less than that of the body constituting the latter whereby an area of an intersected part formed by a combination of the divided electrode and the common electrode, i.e., an area of each of the light beam receiving sections becomes relatively constant among them.

In the film type photoelectric converting device of the invention an effect of unevenness or irregularity along the end part of the common electrode on image reproductivity of the respective light beam receiving sections is substantially reduced to an extent of practicably negligible level so that constant and stable signals can be obtained from each of the light beam receiving elements.

Another advantageous feature of the invention is that the improved film type photoelectric converting device can be manufactured at a remarkably increased yielding rate.

BRIEF DESCRIPTION OF THE DRAWINGS

The accompanying drawings will be briefly described below.

DESCRIPTION OF THE PREFERRED EMBODIMENT

Figure 1A:
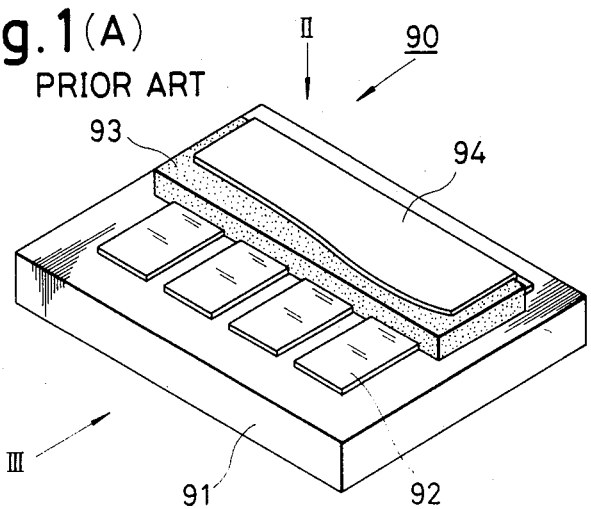
FIG. 1(A) is a perspective view of a conventional film type photoelectric converting device.
Figure 1B:
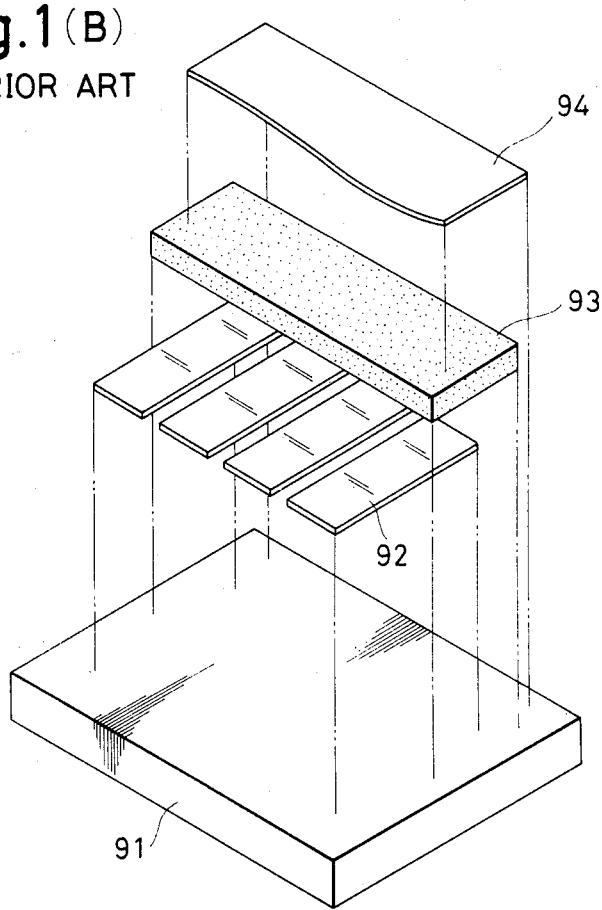
FIG. 1(B) is a perspective view of the film type photoelectric converting device in FIG. 1, shown in a disassembled state.
Figure 2:
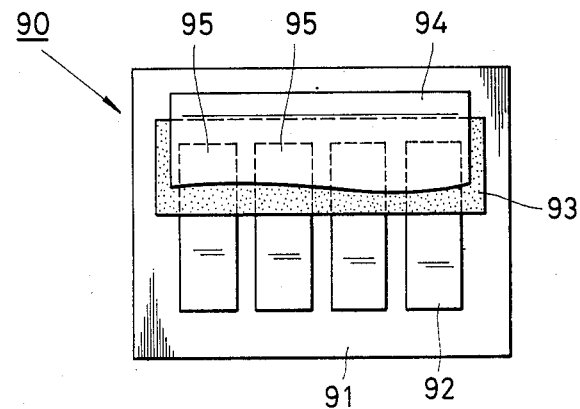
FIG. 2 is a plan view of the device as seen in the direction identified with an arrow mark II in FIG. 1.
Figure 3:
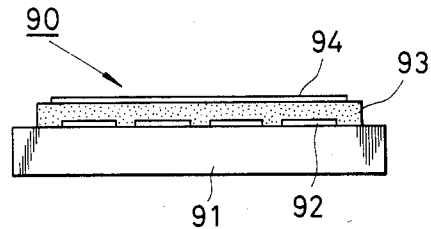
FIG. 3 is a front view of the device as seen in the direction identified with an arrow mark III in FIG. 1.
Figure 4:
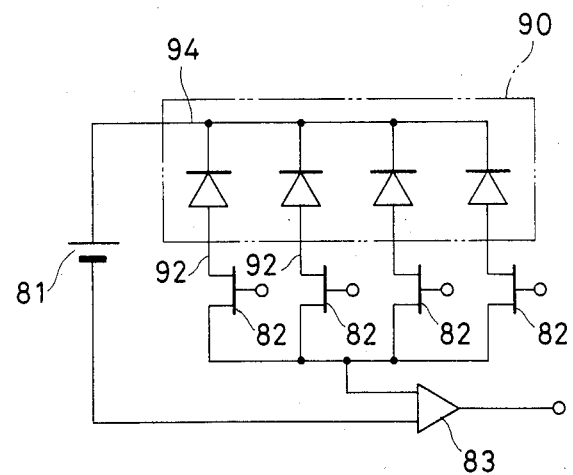
FIG. 4 is a circuit diagram illustrating an example of a driving circuit for the device.
Figure 5:
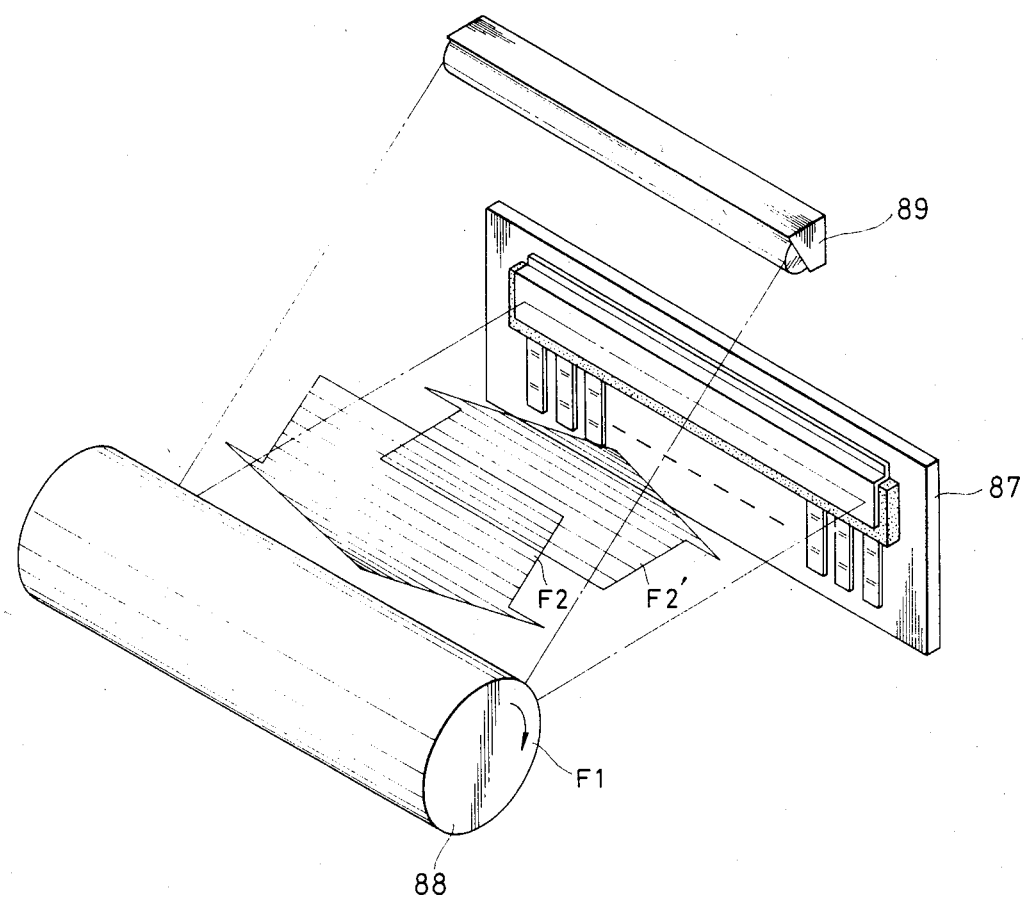
FIG. 5 is a schematic perspective view illustrating how a facsimile equipment is operated.
Figure 6:
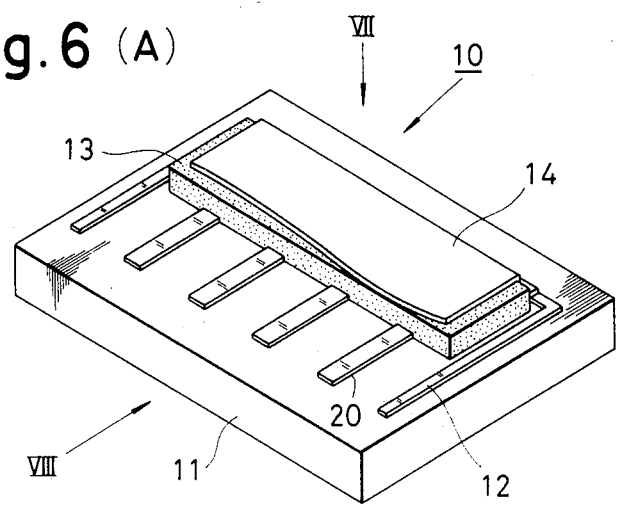
FIG. 6(A) is a perspective view of a film type photoelectric converting device in accordance with the present invention.
FIG. 6(B) is a perspective view of the film type photoelectric converting device in FIG. 6(A), shown in a disassembled state.
Figure 6:
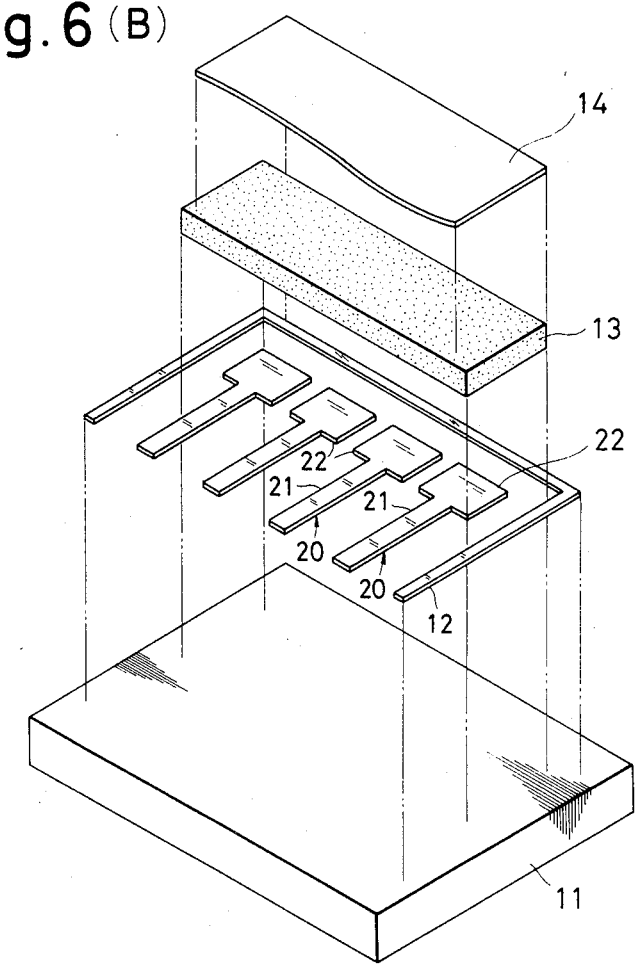
Figure 7:
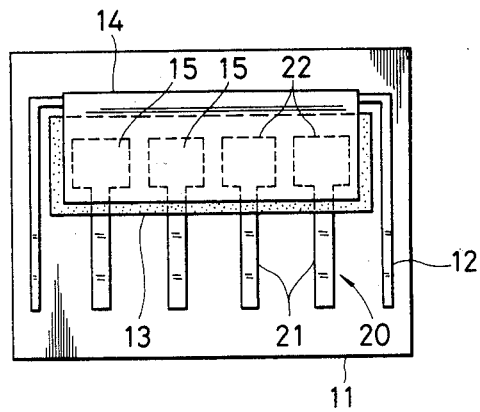
FIG. 7 is a plan view of the device as seen in the direction identified with an arrow mark VII in FIG. 6(A).
Figure 8:
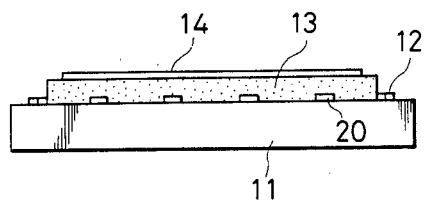
FIG. 8 is a front view of the device as seen in the direction identified with an arrow mark VIII in FIG. 6(A)
Figure 9:
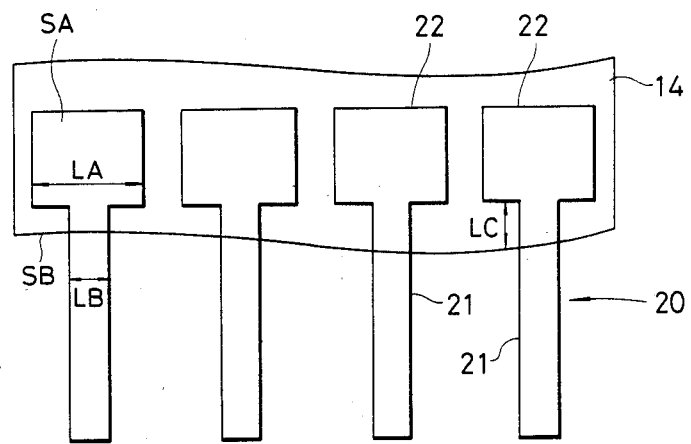
FIG. 9 is an enlarged plan view illustrating how a plurality of divided electrods and a common electrode are superimposed one above another.

Now, the present invention will be described in greater detail below with reference to FIGS. 6 to 9 which illustrate a preferred embodiment of the invention, wherein FIG. 6(A) is a perspective view illustrating the whole structure of a film type photoelectric converting device, FIG. 6(B) is a perspective view of the same shown in a disassembled state, FIG. 7 is a front view as seen in the direction identified with an arrow mark VII in FIG. 6(A), FIG. 8 is a front view as seen in the direction identified with an arrow mark VIII in FIG. 6(A), and FIG. 9 is an enlarged plan view illustrating how the electrodes are superimposed one above another.

Referring to FIGS. 6 to 9, a plurality of divided electrodes 20 and an inverted U-shaped lead-out electrode 12 are placed on a base board 11 made of insulating material in the illustrated manner, each of said divided electrodes 20 comprising a square upper electrode portion 22 having a width LA to constitute a light beam receiving section 15 and a lower electrode portion 21 having a width LB (FIG. 9). A layer of photoelectric film 13 is coated over the divided electrodes 20 so as to cover the upper electrode portions 22 sufficiently and a layer of common electrode 14 is placed to cover said photoelectric film 13 and overlap the electrode 12 along the one end part thereof. How the common electrode 14 and the divided electrodes 20 overlap one above another will be apparent from FIG. 9 and at least the upper electrode portions 22 are sufficiently covered with the common electrode 14.

Next, the configuration of the divided electrodes 20 will be described.

As illustrated in FIG. 9, the common electrode 14 and the divided electrodes 20 are fully superimposed one above another in a cross relation at the upper electrode portions 22 in the above-described manner so that the whole superimposed area serves as a light beam receiving section 15. On the other hand, the lower electrode portions 21 and the common electrode 14 are partially superimposed one above another in the proximity of the upper electrode portions 22. It should be of course understood that the partially superimposed area of the lower electrode portions 21 also serves for photoelectric conversion. Assuming that the extent of superimposition of the common electrode 14 and the lower electrode portions 21 is represented by LC (note that L≠0) as shown in FIG. 9, an intersection area SB can be obtained from the following equation.

$$SB = LC \cdot LB \tag{1}$$

Further, assuming that an area of the upper electrode portion 22, i.e., an area of a light beam receiving section 15 is identified with SA, a ratio GS of intensity of signal corresponding to the aforesaid intersection area SB to intensity of signal corresponding to the last mentioned area SA is represented by the following equation.

$$GS = SB/SA \tag{2}$$

It has been found that a practicably acceptable value of ratio GS is preferably less than 0.1 from the viewpoint of easiness of multiplication of signals, designing of signal processing circuit and manufacturing cost, i.e., the number of signals corresponding to SB amounts to less than 10% of the number of signals corresponding to SA, as represented in the following.

$$GS \leq 0.1 \tag{3}$$

When a photoelectric converting device having a length (in the direction of main scanning) longer than 100 mm is manufactured, it is generally said that an error in the range of ±10 microns is usual as long as the conventional patterning method is employed for manufacturing. For this reason the aforesaid extent of superimposition LC is expected to amount to at largest 20 microns. Accordingly, when a film type photoelectric converting device is manufactured which is dimensioned about 100 microns of LA and 10,000 square microns of SA, i.e., has an image resolution no less than 8 bits/mm, the following result is obtained with respect to a value of LB from the equations (1) to (3) in order that a value of GS is less than 0.1.

LB ≦ 50 microns

Thus, it is possible to reduce variation or fluctuation in image reproduction of the light beam section to an extent of practicably negligible level by dimensioning the lower electrode portion 21 in such a manner that its width LB is smaller than half of the width LA of the upper electrode portion 22, even when GS≦0.1 is caused and thereby there occurs unevenness along the end part of the common electrode 14.

Now, several data which have been adapted in experimentally manufactured devices will be shown as follows.

The first example of experimentally manufactured device is such that a layer of cromium having a thickness of 2000 Å is deposited over a base board made of glass at a temperature of 200° C. by utilizing the conventional electron beam vapourizing method and it is then processed to the pattern of divided electrodes 20 as illustrated in FIG. 6 by utilizing the conventional photo-lithographic method. The width LA is dimensioned 100 microns, whereas the width LB is dimensioned 25 microns. The upper electrode portions 22 are configured to a square respectively. Next, a layer of amorphous silicon hydride film having a thickness of 1 micron is deposited over the upper electrode portions 22 by utilizing the conventional plasma CVD method so as to serve as a photoelectric film 13. Further, a layer of transparent electrode, i.e., a light beam receiving electrode having a thickness of 1000 Å is deposited over said photoelectric film 13 with the aid of a suitable mask. On completion of the above-described steps it is found that LC is dixensioned in the range of 30 to 40 microns with respect to any single light beam receiving section but it is dimensioned in the range of 10 to 40 microns between the adjacent light beam receiving sections.

Further, by measuring output signals from each of the light beam receiving sections prepared by the above-described steps it is found that a value of GS is in the range of ±2% with respect to a single light beam receiving section and it is in the range of ±5% between the adjacent ones and as a result the equation (3) is satisfactorily fulfilled.

Next, the section example of experimentally manufactured device is such that a layer of crominum having a thickness of 3000 Å is deposited over the base board made of ceramic by utilizing the conventional electron beam vapourizing method while it is heated up to a temperature of 250° C., said base board being lined with glass by a thickness of 10 microns, and it is processed to the pattern of divided electrodes 20 as illustrated in FIG. 6 in the same manner as in the foregoing example. The width LA is dimensioned 80 microns, whereas the width LB is dimensioned 20 microns. The photoelectric film 13 and the common electrode 14 are prepared in the same manner as in the foregoing first example.

In this example it is found that LC is dimensioned in the range of 20 to 30 microns with respect to a single light beam receiving element but it is in the range of 10 to 40 microns between the adjacent ones. Further, by measuring output signals from each of the light beam receiving sections in the same manner it is found that a value of GS is in the range of ±3% with respect to a single light beam receiving section and it is in the range of ±6% between the adjacent ones.

While the present invention has been described above with respect to an embodiment and two examples of experimentally manufactured devices in which an electrode to be interposed between the base board 11 and the photoelectric film 13 is designed in the form of a plurality of divided electrodes, it should be of course understood that the present invention should be not limited only to this but it may be designed as a common electrode for each of the light beam receiving sections while the aforesaid common electrode 14 may be designed in the form of a plurality of divided electrodes.

What is claimed is:

1. In a photoelectric converting device comprising an insulative base board, a plurality of divided electrodes, a photoelectric layer and a common electrode, said baseboard, divided electrodes, photoelectric layer and common electrode being placed one above another to form light beam receiving sections at overlapping areas between said divided electrodes and said common electrode, the improvement consisting in that the width of a photoelectric current lead-out portion extending from each of said light beam receiving sections of the divided electrodes is dimensioned less than the width of its respective divided electrode.

2. A photoelectric converting device as defined in claim 1, wherein the width of the photoelectric current lead-out portion extending from each of the divided electrodes is so dimensioned that an area of an overlapping part formed by that portion of the photoelectric current lead-out portion facing the common electrode is less than 10% of an area of the light beam receiving section of its respective divided electrode.

3. A photoelectric converting device comprising:
   (a) an insulative face;
   (b) a plurality of divided electrodes disposed on said insulative face;
   (c) a plurality of lead portions, each of said lead portions being electrically connected to one of said divided electrodes;
   (d) a photoelectric layer disposed over said divided electrodes and said lead portions;
   (e) a common electrode disposed over said photoelectric layer and in facing relationship to said divided electrodes and said lead portions, the areas of said common electrode facing said divided electrode and facing said lead portions defining areas of intersection, a first area of intersection between each of said divided electrodes and said common electrode being greater than a second area of intersection between each of said lead portions and said common electrode the width of each of said divided electrodes being greater than the width of its respective lead portion.

4. A photoelectric converting device as in claim 3, wherein said first area associated with each of said divided electrodes is at least ten times as great as its respective second area associated with its respective lead portion.

5. A photoelectric converting device as in claim 3, wherein any of said first areas is at least ten times greater than any of said second areas associated with said lead portion.

* * * * *